(12) United States Patent
Wang et al.

(10) Patent No.: US 11,256,127 B2
(45) Date of Patent: Feb. 22, 2022

(54) DISPLAY SUBSTRATE, DISPLAY PANEL AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Yan Wang, Beijing (CN); Xuelu Wang, Beijing (CN); Huilian Wang, Beijing (CN); Jie Tong, Beijing (CN); Peimao Li, Beijing (CN); Kai Chen, Beijing (CN); Xiaofeng Zhang, Beijing (CN); Ruichao Liu, Beijing (CN); Dongdong Song, Beijing (CN); Wei Wei, Beijing (CN); Tianhui Liu, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 817 days.

(21) Appl. No.: 16/071,682

(22) PCT Filed: Dec. 14, 2017

(86) PCT No.: PCT/CN2017/116063
§ 371 (c)(1),
(2) Date: Jul. 20, 2018

(87) PCT Pub. No.: WO2018/205603
PCT Pub. Date: Nov. 15, 2018

(65) Prior Publication Data
US 2021/0200021 A1    Jul. 1, 2021

(30) Foreign Application Priority Data
May 10, 2017 (CN) .......................... 201720519399.3

(51) Int. Cl.
*G02F 1/1335* (2006.01)
*H01L 27/32* (2006.01)

(52) U.S. Cl.
CPC .. *G02F 1/133514* (2013.01); *G02F 1/133512* (2013.01); *H01L 27/322* (2013.01)

(58) Field of Classification Search
CPC ......... G02F 1/133514; G02F 1/133512; H01L 27/322
(Continued)

(56) References Cited

U.S. PATENT DOCUMENTS

2010/0289994 A1* 11/2010 Nonaka ................. G02F 1/1368
349/108
2016/0178940 A1  6/2016 Yuan et al.
2018/0337217 A1  11/2018 Zang et al.

FOREIGN PATENT DOCUMENTS

CN   104570457 A   4/2015
CN   105185815 A   12/2015
(Continued)

OTHER PUBLICATIONS

International Search Report and Written Opinion dated Mar. 13, 2018; PCT/CN2017/116063.

*Primary Examiner* — Charles S Chang (57) ABSTRACT

A display substrate, a display panel and a display device are provided. The display substrate includes a plurality of pixel groups arranged in a first direction. Each pixel group at least includes a first pixel column and a second pixel column arranged sequentially along the first direction. The first pixel column includes one first display pixel or a plurality of first display pixels arranged in a second direction interesting with the first direction. The second pixel column includes one second display pixel or a plurality of second display pixels arranged in the second direction. The outline of the display (Continued)

area of the display substrate includes a first outline section not parallel to either the second direction or the first direction.

20 Claims, 4 Drawing Sheets

(58) Field of Classification Search
USPC .................................................. 349/145–146
See application file for complete search history.

(56) References Cited

FOREIGN PATENT DOCUMENTS

| | | |
|---|---|---|
| CN | 105511152 A | 4/2016 |
| CN | 105788470 A | 7/2016 |
| CN | 106707606 A | 5/2017 |
| KR | 1020050065835 A | 6/2005 |

\* cited by examiner

DISPLAY SUBSTRATE, DISPLAY PANEL AND DISPLAY DEVICE

TECHNICAL FIELD

Embodiments of the present disclosure relate to a display substrate, a display panel and a display device.

BACKGROUND

With the continuous development of display technology, consumers require that display devices have good resolution and contrast, and expect that display devices have fashion appearances, so, display devices with abnormal shapes, namely, non-rectangular shapes, such as circular wearable display devices, have been applied widely.

SUMMARY

At least one embodiment of the present disclosure provides a display substrate comprising a plurality of pixel groups arranged in a first direction, each of the pixel groups at least comprises a first pixel column and a second pixel column arranged sequentially along the first direction; the first pixel column comprises one first display pixel or a plurality of the first display pixels arranged in a second direction intersecting with the first direction; the second pixel column comprises one second display pixel or a plurality of the second display pixels arranged in the second direction; and an outline of a display area of the display substrate comprises a first outline section not parallel to either the second direction or the first direction.

For example, in the display substrate provided by at least one embodiment of the present disclosure, the first outline section intersects with corresponding pixel groups, which form bevel edges not parallel to either the second direction or the first direction; and the second direction is perpendicular to the first direction.

For example, in the display substrate provided by at least one embodiment of the present disclosure, at least one part of the bevel edge coincides with a line connecting centers of the first display pixels and the second display pixels abutting the bevel edge.

For example, in the display substrate provided by at least one embodiment of the present disclosure, shapes of the first display pixels and the second display pixels are squares or rectangles.

For example, in the display substrate provided by at least one embodiment of the present disclosure, at least one part of the bevel edge coincides with diagonals of the first display pixels and the second display pixels abutting the bevel edge.

For example, in the display substrate provided by at least one embodiment of the present disclosure, an angle between the bevel edge and the second direction is 10° to 80°.

For example, in the display substrate provided by at least one embodiment of the present disclosure, the angle between the bevel edge and the second direction is 40°-50°.

For example, in the display substrate provided by at least one embodiment of the present disclosure, a plurality of the bevel edges are parallel to each other.

For example, in the display substrate provided by at least one embodiment of the present disclosure, the outline of the display area of the display substrate further comprises a second outline section parallel to the second direction disposed between adjacent ones of the bevel edges.

For example, in the display substrate provided by at least one embodiment of the present disclosure, a size of the second outline section in the second direction is equal to an integer times a size of each first display pixel in the second direction.

For example, in the display substrate provided by at least one embodiment of the present disclosure, the first display pixels have a color different from that of the second display pixels.

For example, in the display substrate provided by at least one embodiment of the present disclosure, each of the pixel groups comprises the first pixel column, the second pixel column and a third pixel column arranged sequentially in the first direction. The third pixel column comprises one third display pixel or a plurality of the third display pixels arranged in the second direction; and the third display pixels have a color different from that of the first display pixels and the second display pixels.

For example, in the display substrate provided by at least one embodiment of the present disclosure, color of the first display pixels, color of the second display pixels and color of the third display pixels are red, green and blue, respectively.

For example, in the display substrate provided by at least one embodiment of the present disclosure, at least one part of the bevel edge coincides with a line connecting centers of the first display pixels, the second display pixels and the third display pixels abutting the bevel edge.

For example, the display substrate provided by at least one embodiment of the present disclosure further comprises a light shielding member. The light shielding member is disposed in an area of the pixel groups on a light exiting side that corresponds to a periphery area of the display substrate to form the outline of the display area of the display substrate.

For example, in the display substrate provided by at least one embodiment of the present disclosure, the light shielding member is in a same layer as a black matrix in the display area.

For example, in the display substrate provided by at least one embodiment of the present disclosure, the outline of the display area of the display substrate is formed by cutting the display substrate.

At least one embodiment of the present disclosure also provides a display panel comprising any of the display substrates. The display panel is one of a liquid crystal display panel, an organic light-emitting-diode display panel and a light-emitting-diode display panel.

For example, in the display panel provided by at least one embodiment of the present disclosure, the display panel is the liquid crystal display panel.

At least one embodiment of the present disclosure also provides a display device comprising any of the display substrates or any of the display panels.

BRIEF DESCRIPTION TO THE DRAWINGS

To illustrate the technical solution of the embodiments of the present disclosure more clearly, the accompanied drawings of the embodiments will be briefly introduced below. It is apparent that the accompanied drawings as described below are only related to some embodiments of the present disclosure, but not limitative of the present disclosure.

DETAILED DESCRIPTION

To allow objectives, technical solutions and advantages of embodiments of the present disclosure to be clearer, the technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, a person of ordinary skill in the art can obtain other embodiment(s), without any creative work, which shall be within the scope of the disclosure.

Unless otherwise defined, all of the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Figure 1:
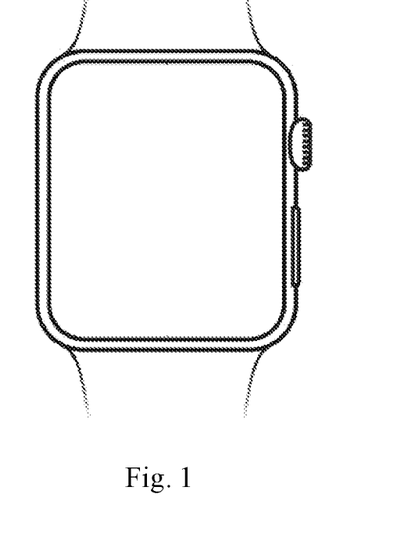
FIG. 1 is a smart watch.
Figure 2A:
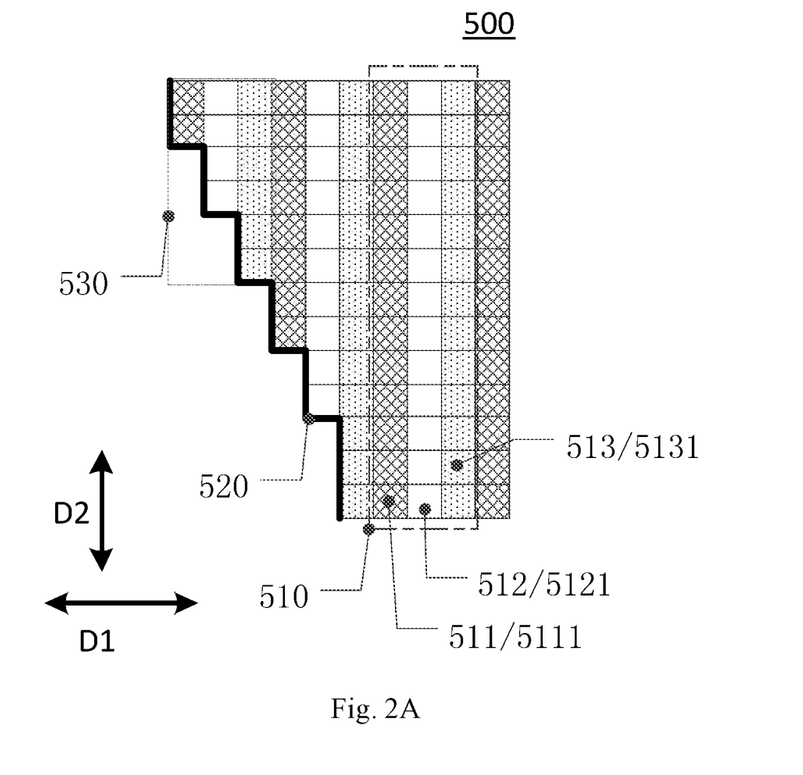
FIG. 2A is a schematic diagram of a display substrate.

FIG. 2A is a diagram showing a display substrate 500. The display substrate 500 may serve as a display substrate for a wearable display device, for example, the smart watch shown in FIG. 1. As shown in FIG. 1, the smart watch has a rounded rectangle display screen, which has four arc-shaped corners as compared to a conventional rectangular screen. Similar screens may be referred to as abnormal shaped screens. Other types of abnormal shaped screens include circular screens, for example. In order to implement irregular edges (such as edges neither parallel to the column direction of the display panel nor parallel to lateral direction of the display panel) of an abnormal shaped screen, it is required to change the arrangement of partial display pixels or the shapes of visible parts. For example, in order to change the shapes of visible parts of display areas at edges, for example, it is possible to change the coverage regions of the black matrix to extend the black matrix into the pixel region originally used for display illumination, thereby converting the rectangular visible pixel part into a triangle.

For example, the display substrate 500 may suffer edge saw-teeth and/or edge color bars. For example, as shown in FIG. 2A, the display substrate 500 includes a plurality of pixel groups 510 arranged in the first direction D1. Each pixel group 510 includes a first pixel column 511, a second pixel column 512 and a third pixel column 513 arranged sequentially in the direction D1. The first pixel column 511 includes a plurality of display pixels 5111 arranged in a second direction D2 intersecting with (e.g., perpendicular to) the first direction D1. The second pixel column 512 includes a plurality of second display pixels 5121 arranged in the second direction D2. The third pixel column 513 includes a plurality of third display pixels 5131 arranged in the second direction D2. For example, as shown in FIG. 2A, the outline 520 of the display area of the display substrate 500 (namely the outline formed at the boundary of the display area) includes a saw-tooth-like outline. The inventors found out that the saw-tooth-like outline may cause saw-tooth-like edges to the display substrate 500. Furthermore, the inventor further noticed that the display substrate 500 shown in FIG. 2A suffers the problem of missing four same display pixels sequentially and therefore may cause edge color bars. For example, in case that the first display pixels 5111, the second display pixels 5121 and the third display pixels 5131 are of red, green and blue, respectively, four red display pixels, two green display pixels and zero blue display pixel are missed sequentially respectively in region 530. In this case, this could result in bluish green color bars in the display substrate 500.

Figure 2B:
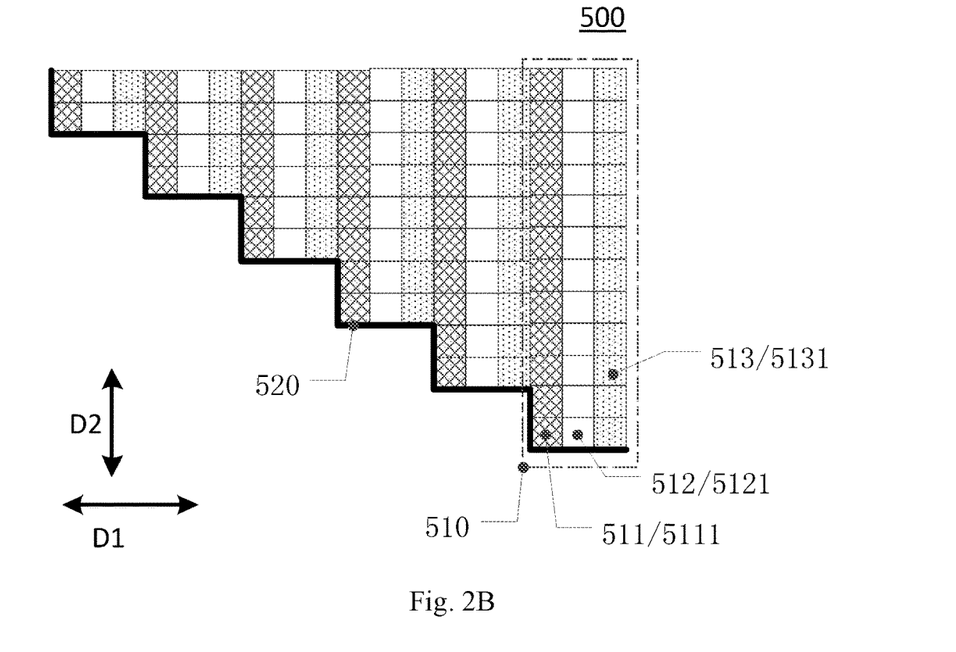
FIG. 2B is a schematic diagram of another display substrate.

The inventors noticed that it is possible to alleviate edge color bar problem with the display substrate 500 as shown in FIG. 2B, such that, in the display area, the numbers of first display pixels 5111, second display pixels 5121 and third display pixels 5131 in each pixel group 510 are equal, however, the inventor noticed that the display substrate 500 shown in FIG. 2B would further exacerbate the edge saw teeth, thereby depressing the user's experience.

Embodiments of the present disclosure provide a display substrate, a display panel and a display device which can alleviate edge color bars while reducing edge saw teeth.

An embodiment of the present disclosure provides a display substrate including a plurality of pixel groups arranged in a first direction. Each pixel group includes at least a first pixel column and a second pixel column arranged sequentially in the first direction. The first pixel column includes one first display pixel or a plurality of first display pixels arranged in a second direction intersecting with the first direction. The second pixel column includes one second display pixel or a plurality of second display pixels arranged in the second direction. The outline of the display area of the display substrate includes a first outline section not parallel to the second direction and the first direction.

Figure 3:
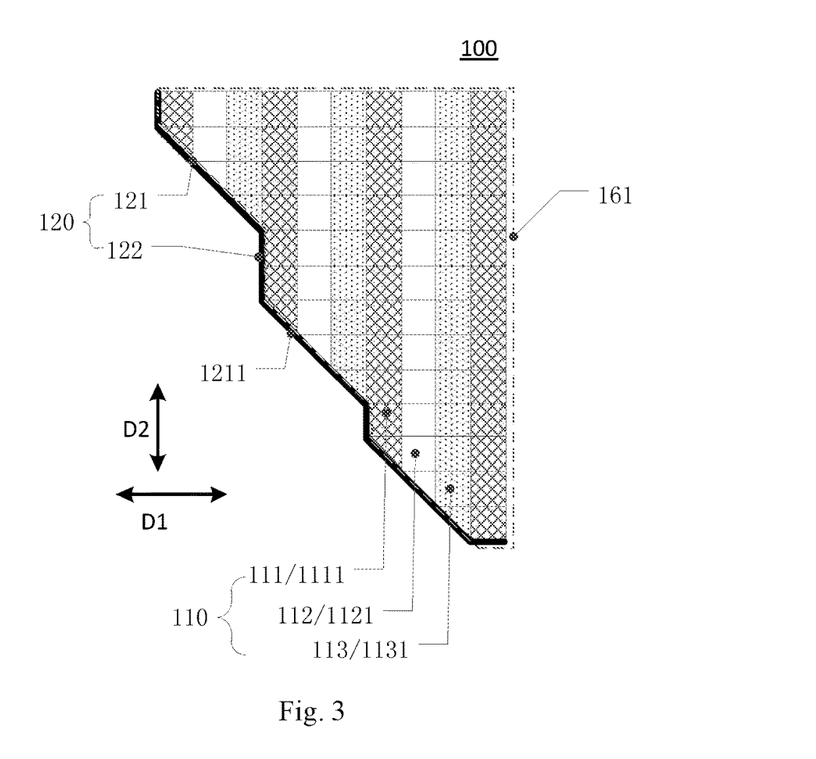
FIG. 3 is a schematic plan diagram of a display substrate provided in an embodiment of the present disclosure.

For example, FIG. 3 is a schematic plan diagram of a display substrate 100 provided in an embodiment of the present disclosure. The display substrate 100 is adapted to form a display panel and a display device with a circular outline or profile, for example. For example, as shown in FIG. 3, the display substrate 100 includes a plurality of pixel groups 110 arranged in the first direction D1. For example, each pixel group 110 includes a first pixel column 111 and a second pixel column 112 arranged sequentially in the first direction D1. The first pixel column 111 includes one display pixel 1111 or a plurality of first display pixels 1111 arranged in a second direction D2 intersecting with (e.g., perpendicular to) the first direction D1. The second pixel column 112 includes one second display pixel or a plurality of second display pixels 1121 arranged in the second direction D2. For example, according to a practical application demand, each pixel group 110 may further include a third pixel column 113 that may include one third display pixel 1131 or a plurality of third display pixels 1131 arranged in the second direction D2. For example, according to a practical application demand, each pixel group 110 may further include a fourth pixel column, and a fifth pixel column (not shown in the figures) or the like, which will not be repeated here. For example, according to a practical application demand, each pixel group 110 may include equal number of pixel columns. For example, in case each pixel group 110 includes 3 pixel columns, each pixel group 110 may include only the first pixel column 111, the second pixel column 112 and the third pixel column 113 arranged sequentially in the first direction D1.

For example, the first display pixel 1111 has a color different from that of the second display pixel 1121. For example, in case each pixel group 110 further includes the third pixel column 113, the third display pixel 1131 may have a color different from that of the first display pixel 1111 and the second display pixel 1121. For example, the color of the first display pixel 1111, the color of the second display pixel 1121 and the color of the third display pixel 1131 are red, green and blue, respectively. However, embodiments of the present disclosure are not limited thereto. For example, the color of the first display pixel 1111, the color of the second display pixel 1121 and the color of the third display pixel 1131 may also be blue, red and green, respectively. For example, according to a practical application demand, the color of the first display pixel 1111, the color of the second display pixel 1121 and the color of the third display pixel 1131 may be the same (e.g., blue).

For example, the display substrate 100 may not emit light. For example, the display substrate may be implemented as a color filter substrate of a liquid crystal display panel, in which case, the color of the first display pixel 1111, the color of the second display pixel 1121 and the color of the third display pixel 1131 may refer to the color of light transmitted by the first display pixel 1111, the second display pixel 1121 and the third display pixel 1131. As another example, in case that the display substrate 100 does not emit light, the display substrate 100 may also be implemented as an array substrate of a liquid crystal display panel, in which case, the color of the first display pixel 1111, the color of the second display pixel 1121 and the color of the third display pixel 1131 may refer to the color of light transmitted by the color filter of the color filter substrate corresponding to the first display pixel 1111, the second display pixel 1121 and the third display pixel 1131 of the array substrate. As yet another example, the display substrate 100 may also emit light (for example, the display substrate may be an organic light-emitting-diode display panel). In this case, the color of the first display pixel 1111, the color of the second display pixel 1121 and the color of the third display pixel 1131 may refer to the color of light emitted by the first display pixel 1111, the second display pixel 1121 and the third display pixel 1131.

For example, shapes of the first display pixel 1111, the second display pixel 1121 and the third display pixel 1131 may be squares or rectangles. However, embodiments of the present disclosure are not limited thereto. For example, according to a practical application demand, shapes of the first display pixel 1111, the second display pixel 1121 and the third display pixel 1131 may be a triangle or an ellipse. For example, in case that the first display pixel 1111, the second display pixel 1121 and the third display pixel 1131 are in rectangular shape, the ratio of size in the first direction D1 to the size in the second direction D2 of the first display pixel 1111, the second display pixel 1121 and the third display pixel 1131 may be 1:3. However, embodiments of the present disclosure are not limited thereto.

Figure 5:
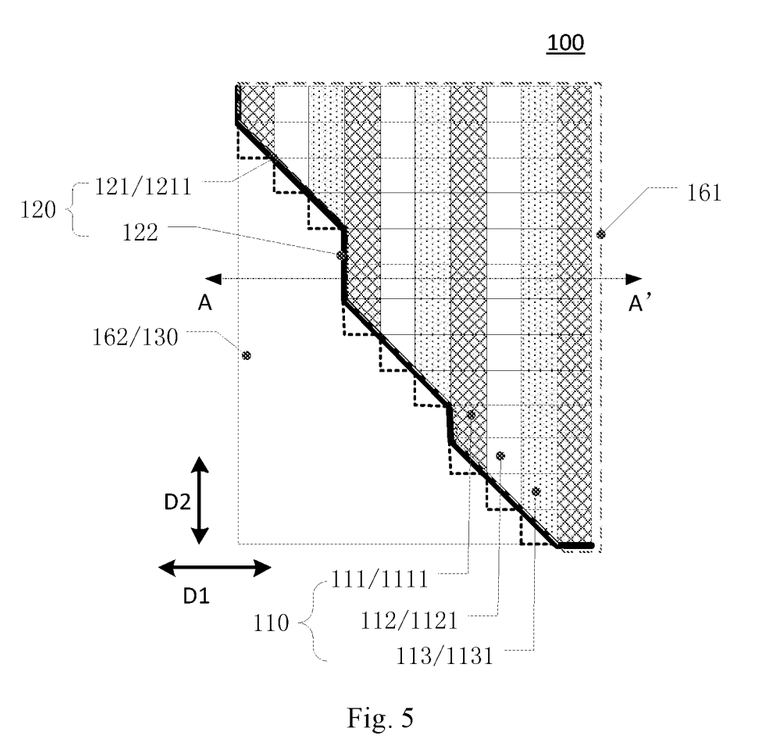
FIG. 5 is a schematic plan diagram of yet another display substrate provided in an embodiment of the present disclosure.

For example, as shown in FIG. 5, the display substrate 100 may include a display area 161 and a periphery area 162. For example, the display area 161 may be located ill the middle area of the display substrate 100, the periphery area 162 may be the area outside the display area 161 and inside the boundary of the display substrate 100. For example, the outline 120 of the display area 161 of the display substrate 100 is formed at the location where the display area 161 joins the periphery area 162. For example, according to a practical application demand, the display substrate 100 may further include a light shielding member 130 disposed on the light emitting side of the plurality of pixel groups 110, which may be disposed in the periphery area 162 of the display substrate 100, for example, thereby blocking the periphery area 162 to emit light and forming the outline 120 of the display area 161 of the display substrate 100. For example, the light shielding member 130 may block light emitted by display pixels. For example, the ratio of the intensity of light blocked by the light shielding member 130 to that of the light incident on the shielding member 130 may be greater than 99.9%. However, embodiments of the present disclosure are not limited thereto. The part indicated by the dashed lines in the display pixels in the edge outline in FIG. 5 is the part blocked by the light shielding member 130, while the part not blocked by the light shielding member 130 constitutes the visible part of the display pixels.

It is to be noted that the size and shape of the light shielding member 130 may be set as required and embodiments of the present disclosure do not impose any limitation thereto. For example, shapes of the light shielding member 130 and the display area 161 may be complementary, that is, the top view of the shielding member 130 and the display area 161 may form a square or a rectangle, respectively. As another example, the shapes of any light shielding member (such as the part indicated by the dashed lines in the display pixels in the edge outline shown in FIG. 5) and the display pixels abutting the bevel edge may be complementary. That is, the top view of any light shielding member and the display pixels abutting the bevel edge 1211 may form a square or a rectangle.

Figure 6A:
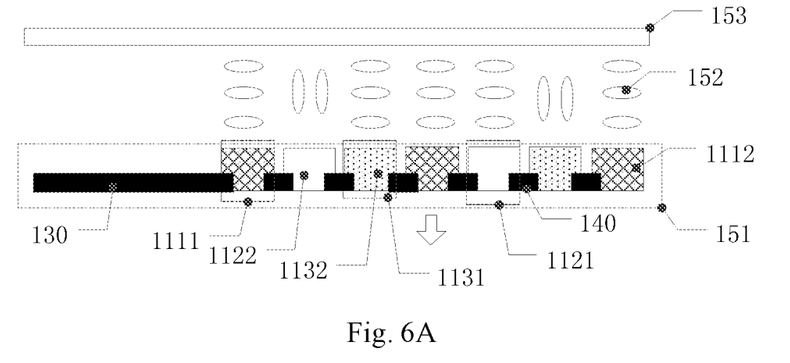
FIG. 6A is a schematic cross-section view of a liquid crystal display panel.
Figure 6B:
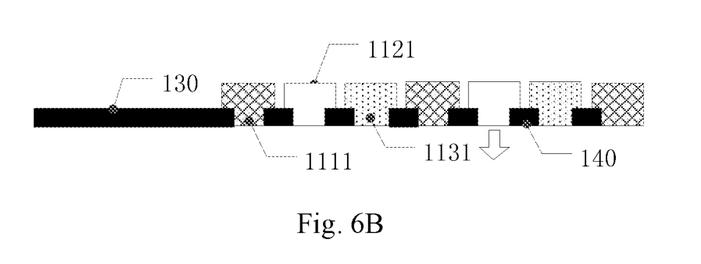
FIG. 6B is a schematic cross-section view of a self-illuminating display panel.

For example, as shown in FIGS. 6A and 6B, according to a practical application demand, the display substrate 100 may further include a black matrix 140 disposed between adjacent display pixels (for example, the black matrix 140 disposed between the first display pixel 1111 and the second display pixel 1121), in which case the light shielding member 130 may be disposed in a same layer as the black matrix 140 in the display area 161. It is to be noted that, according to a practical application demand, the black matrix 140 is disposed between adjacent display pixels and may extend into partial areas of the adjacent display pixel.

For example, FIG. 6A shows a schematic cross-section view of a liquid crystal display panel. For example, as shown in FIG. 6A, the liquid crystal display panel may include the display substrate as shown in FIG. 5A, and at least a part of FIG. 6A may be obtained by cutting substrate through line A-A' shown in FIG. 5. For example, the liquid crystal display panel may include an array substrate 153, a liquid crystal layer 152 and an opposed substrate 151. For example, the opposed substrate 151 may include a first color filter 1112, a second color filter 1122, a third color filter 1132, a black matrix 140 and a light shielding member 130. For example, the first color filter 1112, the second color filter 1122 and the third color filter 1132 may be red, green and blue, respectively. However, embodiments of the present disclosure are not limited thereto. For example, as shown in FIG. 6A, the display substrate 100 shown in FIG. 5 may be implemented as an opposed substrate 151, in which case, even if pixel units corresponding to periphery area on the array substrate 153 are not blocked or cut, there is no light emitted from the periphery area because the light shielding members are provided on the opposed substrate 151, thereby the manufacturing process is simplified.

For example, FIG. 6B is a schematic cross-section view of a self-illuminating display panel. For example, as shown in FIG. 6B, the self-illuminating display panel may include the display substrate as shown in FIG. 5A, and at least a part of FIG. 6B may be obtained by cutting the substrate along the line A-A' shown in FIG. 5. For example, the self-illuminating display panel may include first display pixels 1111, second display pixels 1121, third display pixels 1131, a black matrix 140 and light shielding members 130. For example, first display pixels 1111, second display pixels 1121, and third display pixels 1131 may emit light. For example, the first display pixels 1111, the second display pixels 1121, and the third display pixels 1131 may emit red, green and blue light, respectively. However, embodiments of the present disclosure are not limited thereto. For example, as shown in FIG. 6B, the display substrate 100 shown in FIG. 5 may be implemented as the self-illuminating display panel shown in FIG. 6B.

For example, as shown in FIG. 3, the display substrate 100 may include only a display area 161. For example, it is possible to only form display pixels (e.g., the first display pixels 1111) corresponding to the display area 161, in the manufacturing process. As another example, it is also possible to form display pixels corresponding to the display area 161 and display pixels corresponding to the periphery area 162 at the same time and then cut the substrate along the outline 120 of the display area 161 such that the display substrate 100 after cutting only includes the display area 161. For example, it is possible to cut the substrate along the outline 120 of the display area 161 by laser.

For example, as shown in FIG. 3, the outline 120 of the display area 161 of the display substrate 100 may include the first outline section 121 not parallel to either the second direction D2 or the first direction D1. For example, the first outline 121 may intersect with corresponding pixel groups 110 and may form a bevel edge 1211 not parallel to either the second direction D2 or the first direction D1. For example, the bevel edge 1211 in embodiments of the present disclosure may be a straight line. For clarity, the present disclosure will be described in detail below with the bevel edge 1211 being a straight light as an example. For example, according to a practical application demand, the bevel edge 1211 in an embodiment of the present disclosure my be an arc edge.

For example, at least a part of each bevel edge 1211 may coincide with the line connecting centers of the first display pixels 1111 and the second display pixels 1121 abutting the bevel edge 1211 in the corresponding pixel groups 110 (namely, pixel groups 110 abutting the bevel edge 1211). For example, at least a part of the bevel edge 1211 may coincide with the line connecting the centers of the first display pixels 1111 and the second display pixels 1121 in adjacent rows and adjacent columns. For example, in case that shapes of the first display pixel 1111 and the second display pixel 1121 are squares or rectangles, at least a part of the bevel edge 1211 may coincide with the diagonals of the first display pixels 1111 and the second display pixels 1121 abutting the bevel edge 1211 in corresponding pixel groups 110. That is, the bevel edge 1211 (or the first outline section 121) may be such that shapes of the first display pixels 1111 and the second display pixels 1121 adjacent to the bevel edge 1211 change from squares or rectangles to right triangles.

For example, as shown in FIG. 3, in case that each pixel group 110 further includes the third pixel column 113, at least a part of the bevel edge 1211 may coincide with the line connecting centers of the first display pixels 1111, the second display pixels 1121 and the third display pixels 1131 abutting the bevel edge 1211 in the corresponding pixel groups 110. For example, in case that shapes of the first display pixel 1111, the second display pixel 1121 and the third display pixel 1131 are squares or rectangles, at least a part of the bevel edge 1211 may coincide with the diagonals of the first display pixel 1111, the second display pixel 1121 and the third display pixel 1131 abutting the bevel edge 1211 in corresponding pixel groups 110. That is, the bevel edge 1211 (or the first outline section 121) may be such that shapes of the first display pixel 1111, the second display pixel 1121 and the third display pixel 1131 adjacent to the bevel edge 1211 change from squares or rectangles to right triangles.

For example, the outline 120 of the display substrate 100 includes a bevel edge 1211, the saw tooth effect of edges of the display substrate 100 with abnormal shapes may be alleviated. As another example, in case that the colors of the first display pixel 1111, the second display pixel 1121 and the third display pixel 1131 are different from each other, by including a bevel edge 1211 in the outline 120, it is possible to avoid sequentially missing a plurality of (e.g., four) display pixels (e.g., the first display pixels) of the same color, thereby the edge color bar problem of the display substrate 100 may be alleviated.

For example, as shown in FIG. 3, according to a practical application demand, the outline 120 of the display area 161 of the display substrate 100 may further include a second outline section 122 disposed between adjacent bevel edges 1211 and parallel to the second direction D2. For example, the size of the second outline section 122 in the second direction D2 is equal to an integer times (such as 1-5 times) of the size of each first display pixel 1111 in the second direction D2, that is, adjacent bevel edges 1211 are spaced apart by N rows (e.g. 1-5 rows) display pixels in the second direction. For example, as shown in FIG. 3, by providing a second outline section 122 parallel to the second direction D2 between adjacent bevel edges 1211, it is possible to increase the area ratio of the first display pixels 1111 in the edge area of the display substrate 100. That is, it is possible to increase the ratio of the intensity of light emitted by the first display pixels 1111 and the sum of intensities of the first display pixels 1111, the second display pixels 1121 and the third display pixels 1131, thereby the edge color bar problem is further alleviated. In addition, by providing the second outline section 122 parallel to the second direction D2 between adjacent bevel edges 1211, it is also possible that the outline shape of the display substrate 100 is diversified.

For example, shapes of the bevel edges 1211 and the outline 120 of the display area 161 in embodiments of the present disclosure arc not limited to those shown in FIG. 3. For example, according to a practical application demand, shapes of the bevel edges 1211 and the outline 120 may also be configured as the forms shown in FIG. 4, in which case, the outline 120 of the display area 161 may further include a third outline section 123 parallel to the first direction D1 disposed between the bevel edge 1211 and the second outline section 122, which may realize diversified outline shapes of the display substrate 100.

Figure 4:
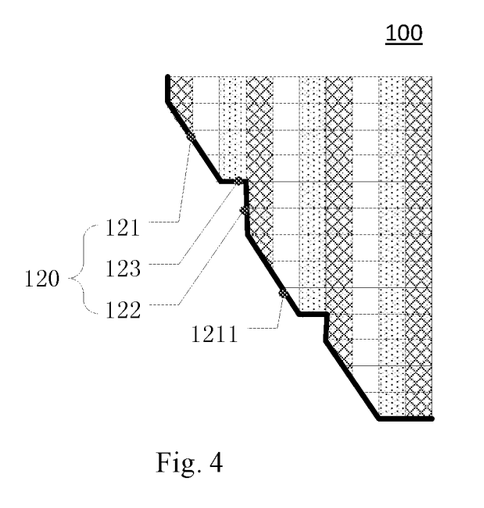
FIG. 4 is a schematic plan diagram of another display substrate provided in an embodiment of the present disclosure.

For example, the configuration forms of the bevel edges 1211 in embodiments of the present disclosure are not limited to the shapes shown in FIGS. 3 and 4. For example, according to a practical application demand, the angle between the bevel edge 1211 and the second direction D2 may be 10° to 80°, such as 15°, 30°, 45°, 60° and 75°.

For example, the angle between the bevel edge 1211 and the second direction D2 may be set according to the inclination angle of the outline 120 of the corresponding display area 161. For example, for the area with a large inclination angle of the outline 120 of the display area 161 with respect to the second direction D2, the inclination angle of the bevel edge 1211 with respect to the second direction D2 may be relatively large; while for the area with a small inclination angle of the outline 120 of the display area 161 with respect to the second direction D2, the inclination angle of the bevel edge 1211 may be small.

For example, as shown in FIG. 3, in case that the outline 120 of the display area 161 includes a plurality of bevel edges 1211, the plurality of bevel edges 1211 may be parallel to each other. For example, the inclination angles of the plurality of bevel edges 1211 may be all set to 45°, 60°, or 30°. However, embodiments of the present disclosure are not limited thereto. For example, according to a practical application demand, it is also possible to set the plurality of bevel edges 1211 not parallel to each other, that is, angles may be formed between different bevel edges 1211.

For example, the shape of bevel edges 1211 may be set based on the shape of display pixels, such as the first display pixels 1111. For example, for square display pixels, display pixels abutting the bevel edges 1211 may be formed by cutting the substrate along the diagonals of the squares; and for rectangular display pixels, display pixels abutting the bevel edges 1211 may be formed by cutting the substrate along the diagonals of the rectangles, which can reduce the difficulty for forming outline 120. For example, the bevel edges 1211 of the embodiments of the present disclosure are not limited to be formed by cutting the substrate along the diagonals and may also be formed by cutting the substrate along any straight lines as required. As another example, the bevel edges 1211 may also be formed by blocking periphery area 162 with the light shielding member 130. As yet another example, the bevel edges 1211 may also be formed directly in the process of forming display pixels (the first display pixels 1111); for example, display pixels with right triangle shape may be formed directly.

Figure 7:
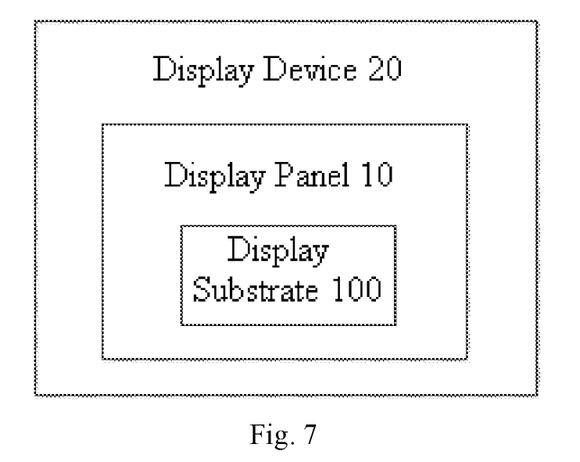
FIG. 7 is an illustrative block diagram of a display panel and a display device of another embodiment of the present disclosure.

At least one embodiment of the present disclosure also provides a display panel 10, which may include the display substrate 100 provided in any embodiment of the present disclosure. For example, the display panel may be a liquid crystal display panel, an organic light-emitting-diode display panel or a light-emitting-diode display panel. At least one embodiment of the present disclosure also provides a display device 20, which may include the display substrate 100 provided in any embodiment of the present disclosure or the display panel 10 provided in any embodiment of the present disclosure.

It is to be noted that other essential constitutional parts for the display panel 10 and the display device 20, such as thin film transistor control device, image data encoding/decoding device, row scanning driver, column scanning driver, and clock circuit, may use applicable conventional components, which are understood by one of ordinary skill in the art, will not be described herein and should not limit the present invention in any way.

Embodiments of the present disclosure provide a display substrate, a display panel and a display device which can alleviate edge color bars while reducing edge saw teeth.

It is apparent that those skilled in the art can make modifications, variations and combinations to embodiments of the present disclosure without departing from the spirit and scope of the present disclosure. Thus, if these modifications, variations and combinations of embodiments of the present disclosure fall within the scope of claims and their equivalents of the present disclosure, it is intended that the present disclosure also encompass these modifications and variations.

The described above are only exemplary embodiments of the present disclosure, and the present disclosure is not intended to be limited thereto. The scope of the present disclosure is defined by the claims.

The present application claims priority of the Chinese Patent Application No. 201720519399.3 filed on May 10, 2017, which is incorporated herein by reference in its entirety as a part of the present application.

What is claimed is:

1. A display substrate comprising a plurality of pixel groups arranged in a first direction, wherein
   each of the pixel groups at least comprises a first pixel column and a second pixel column arranged sequentially along the first direction;
   the first pixel column comprises one first display pixel or a plurality of the first display pixels arranged in a second direction intersecting with the first direction;
   the second pixel column comprises one second display pixel or a plurality of the second display pixels arranged in the second direction; and
   an outline of a display area of the display substrate comprises a first outline section not parallel to either the second direction or the first direction, an outline section parallel to the first direction, and a second outline section parallel to the second direction.

2. The display substrate according to claim 1, wherein the first outline section intersects with corresponding pixel groups, which form bevel edges not parallel to either the second direction or the first direction; and the second direction is perpendicular to the first direction.

3. The display substrate according to claim 2, wherein at least one part of the bevel edge coincides with a line connecting centers of the first display pixels and the second display pixels abutting the bevel edge.

4. The display substrate according to claim 2, wherein shapes of the first display pixels and the second display pixels are squares or rectangles.

5. The display substrate according to claim 4, wherein at least one part of the bevel edge coincides with diagonals of the first display pixels and the second display pixels abutting the bevel edge.

6. The display substrate according to claim 2, wherein an angle between the bevel edge and the second direction is 10° to 80°.

7. The display substrate according to claim 6, wherein the angle between the bevel edge and the second direction is 40°-50°.

8. The display substrate according to claim 2, wherein a plurality of the bevel edges are parallel to each other.

9. The display substrate according to claim 2, wherein the second outline section is disposed between adjacent ones of the bevel edges.

10. The display substrate according to claim 9, wherein a size of the second outline section in the second direction is equal to an integer times a size of each first display pixel in the second direction.

11. The display substrate according to claim 2, wherein the first display pixels have a color different from that of the second display pixels.

12. The display substrate according to claim 11, wherein each of the pixel groups comprises the first pixel column, the second pixel column, and a third pixel column arranged sequentially in the first direction;
the third pixel column comprises one third display pixel or a plurality of the third display pixels arranged in the second direction; and
the third display pixels have a color different from that of the first display pixels and the second display pixels.

13. The display substrate according to claim 12, wherein color of the first display pixels, color of the second display pixels and color of the third display pixels are red, green and blue, respectively.

14. The display substrate according to claim 12, wherein at least one part of the bevel edge coincides with a line connecting centers of the first display pixels, the second display pixels and the third display pixels abutting the bevel edge.

15. The display substrate according to claim 1, further comprising a light shielding member, wherein
the light shielding member is disposed in an area of the pixel groups on a light exiting side that corresponds to a periphery area of the display substrate to form the outline of the display area of the display substrate.

16. The display substrate according to claim 15, wherein the light shielding member is in a same layer as a black matrix in the display area.

17. The display substrate according to claim 1, wherein the outline of the display area of the display substrate is formed by cutting the display substrate.

18. A display panel comprising a display substrate, wherein the display substrate comprises a plurality of pixel groups arranged in a first direction, wherein
each of the pixel groups at least comprises a first pixel column and a second pixel column arranged sequentially along the first direction;
the first pixel column one first display pixel or a plurality of the first display pixels arranged in a second direction interesting with the first direction;
the second pixel column comprises one second display pixel or a plurality of the second display pixels arranged in the second direction;
an outline of a display area of the display substrate comprises a first outline section not parallel to either the second direction or the first direction, an outline section parallel to the first direction, and a second outline section parallel to the second direction; and
wherein the display panel is one of a liquid crystal display panel, an organic light-emitting-diode display panel and a light-emitting-diode display panel.

19. The display panel of claim 18, wherein the display panel is the liquid crystal display panel.

20. A display device comprising a display panel, wherein the display panel comprises a display substrate, the display substrate comprising,
a plurality of pixel groups arranged in a first direction, wherein
each of the pixel groups at least comprises a first pixel column and a second pixel column arranged sequentially along the first direction;
the first pixel column comprises one first display pixel or a plurality of the first display pixels arranged in a second direction intersecting with the first direction;
the second pixel column comprises one second display pixel or a plurality of the second display pixels arranged in the second direction;
an outline of a display area of the display substrate comprises a first outline section not parallel to either the second direction or the first direction, an outline section parallel to the first direction, and a second outline section parallel to the second direction; and
wherein the display panel is one of a liquid crystal display panel, an organic light-emitting-diode display panel and a light-emitting-diode display panel.

\* \* \* \* \*